(12) United States Patent
Ichikawa et al.

(10) Patent No.: US 8,422,762 B2
(45) Date of Patent: Apr. 16, 2013

(54) ABNORMALITY DETECTING APPARATUS FOR DETECTING ABNORMALITY AT INTERFACE PORTION OF CONTACT ARM

(75) Inventors: Masayoshi Ichikawa, Tokyo (JP);
Hiroki Ikeda, Tokyo (JP)

(73) Assignee: Advantest Corporation, Tokyo (JP)

( * ) Notice: Subject to any disclaimer, the term of this patent is extended or adjusted under 35 U.S.C. 154(b) by 484 days.

(21) Appl. No.: 12/738,780

(22) PCT Filed: Oct. 31, 2007

(86) PCT No.: PCT/JP2007/071203
§ 371 (c)(1),
(2), (4) Date: Apr. 19, 2010

(87) PCT Pub. No.: WO2009/057203
PCT Pub. Date: May 7, 2009

(65) Prior Publication Data
US 2010/0239155 A1    Sep. 23, 2010

(51) Int. Cl.
*G06K 9/00* (2006.01)
(52) U.S. Cl.
USPC .......................................................... 382/145
(58) Field of Classification Search .................. 382/145, 382/152
See application file for complete search history.

(56) References Cited

U.S. PATENT DOCUMENTS 4,345,312 A * 8/1982 Yasuye et al. ................. 382/151
2009/0126468 A1   5/2009 Hideno et al.

FOREIGN PATENT DOCUMENTS

| JP | 11-287843 | 10/1999 |
| JP | 2001-221827 | 8/2001 |
| JP | 2002-005990 | 1/2002 |
| KR | 10-1999-0082894 | 11/1999 |
| TW | 1226932 | 1/2005 |
| TW | M270358 | 7/2005 |
| WO | 2006/109358 | 4/2005 |

OTHER PUBLICATIONS

Korea Office action, mail date is Jun. 7, 2011.
China Office action, mail date is Sep. 7, 2011.
Japan Office action, mail date is May 29, 2012.
Taiwan Office action, mail date is Apr. 6, 2012.

* cited by examiner

*Primary Examiner* — Tarifur Chowdhury
*Assistant Examiner* — Abdullahi Nur
(74) *Attorney, Agent, or Firm* — Greenblum & Bernstein, P.L.C.

(57) ABSTRACT

An abnormality detecting apparatus includes an imaging device for obtaining image data of a TIM, a failure detecting section for detecting appearance failures of the TIM on the basis of the image data of the TIM obtained by the imaging device, and a determining device for determining whether an abnormality occurs at the TIM on the basis of a detection result by the failure detecting section.

38 Claims, 12 Drawing Sheets

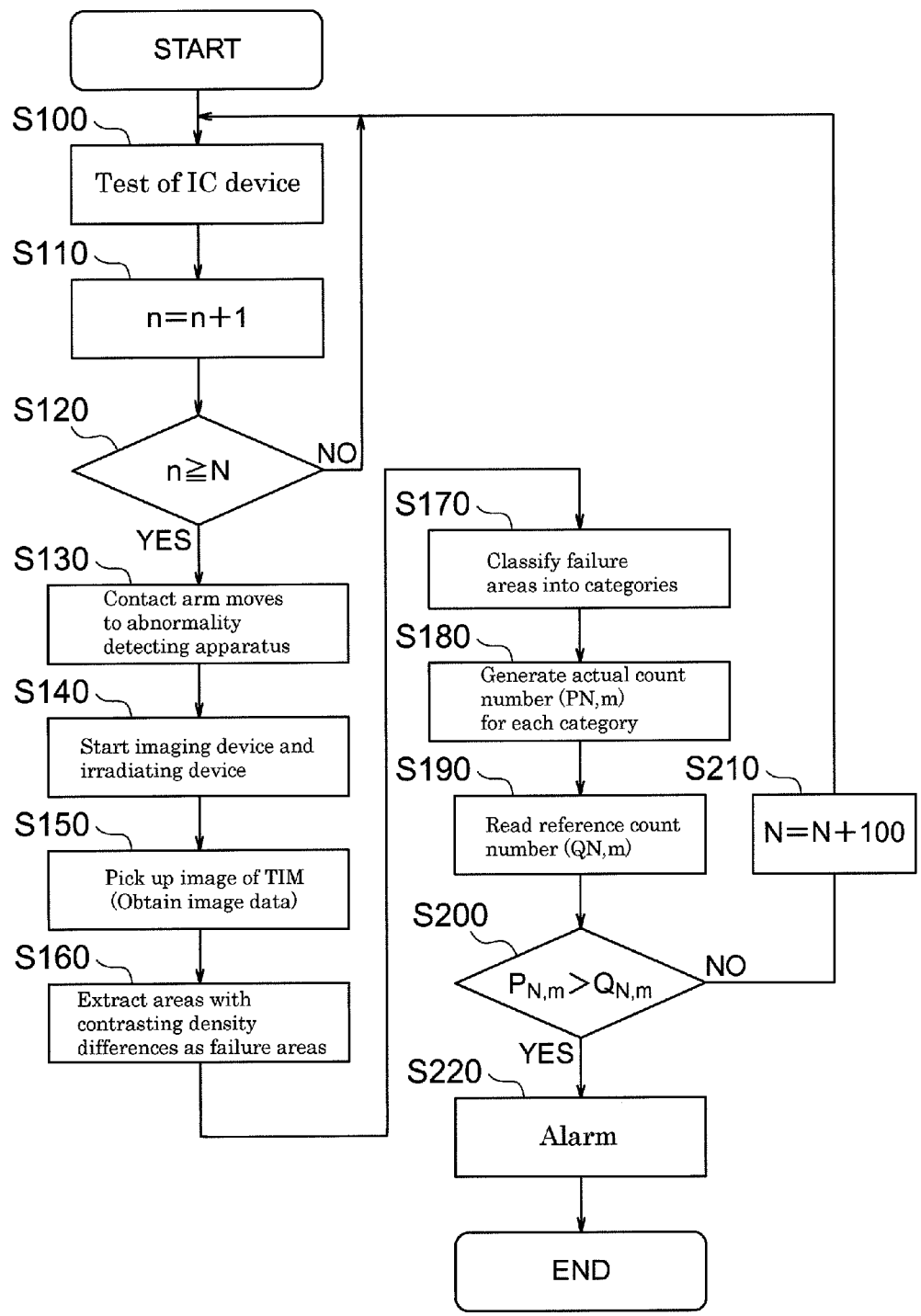

ABNORMALITY DETECTING APPARATUS FOR DETECTING ABNORMALITY AT INTERFACE PORTION OF CONTACT ARM

TECHNICAL FIELD

The present invention relates to an abnormality detecting apparatus for detecting an abnormality at an interface portion of a contact arm which presses a device under test onto a contact portion of a test head in an electronic device testing apparatus, an electronic device testing apparatus and an electronic device testing system with the same, and an abnormality detecting method.

BACKGROUND ART

In production processes for various kinds of electronic devices (hereinafter also representatively referred to as "IC devices") such as semiconductor integrated circuit devices, there is used an electronic device testing apparatus for testing performances and functional capabilities of IC devices.

As a handler which forms an electronic device testing apparatus for testing IC devices requiring relatively short testing time such as SoC (System on Chip) and the like, a type that a contact arm holds each IC device by suction one-by-one and presses the IC device onto a socket of a test head is known (for example, see Patent Document 1).

The contact arm of such handler has a pusher for pressing an IC device onto the socket, and the pusher is provided therein with a temperature controller configured with a heater, a cooler, and the like in order to control the temperature of the IC device. In addition, there is a case that a TIM (Thermal Interface Material) formed of, for example, aluminum foil or the like is attached to an front end of the pusher so that a contact performance between the pusher and the IC device is improved thereby decreasing the thermal resistance therebetween.

Because the TIM is subjected to a repetition of being close contact with an IC device and being removed therefrom while the contact arm holds IC devices by suction, there occur scars and defects on the surface of the TIM or foreign particles such as dusts attach to the surface. Consequently, a TIM which has been contacted with IC devices at a predetermined times is to be newly changed.

However, if the pusher has an front end with insufficient flatness or the contact arm is inclined, scars and defects on the TIM may be significantly increased before completing the predetermined times. Also, if IC devices have burrs or the electronic device testing apparatus is used in a dusty environment, considerable amount of foreign particles may attach to the TIM before completing the predetermined times.

In the case that such an abnormality occurs in the TIM, the thermal resistance between the pusher and the IC device is insufficiently decreased. Therefore, there probably occur problems that it is not possible to control the temperature of the IC device with accuracy and that it takes a long time to reach the IC device to a set temperature.

[Patent Document 1] Japanese Patent Publication (A) No. 2002-5990

DISCLOSURE OF INVENTION

Problem to be Solved by the Invention

The problem to be solved by the present invention is to provide an abnormality detecting apparatus capable of maintaining a good heat conductivity between a contact arm and a device under test, an electronic device testing apparatus and an electronic device testing system with the same, and an abnormality detecting method.

Means for Solving the Problem (1) To achieve the above object, according to a first aspect of the present invention, there is provided an abnormality detecting apparatus for detecting an abnormality of an interface portion with a device under test, the interface portion being provided with a contact arm for pressing the device under test onto a contact portion of a test head in an electronic device testing apparatus for testing the device under test, the abnormality detecting apparatus comprising: an obtaining means for obtaining an appearance information of the interface portion of the contact arm; a failure detecting means for detecting an appearance failure of the interface portion on the basis of the appearance information obtained by the obtaining means; and a determining means for determining whether the abnormality occurs at the interface portion on the basis of a detection result by the failure detecting means (see claim 1).

Although not particularly limited in the above invention, preferably the interface portion includes a thin-plate-shaped member or a thin-film-shaped member provided on a front end of the contact arm, or a liquid applied on the front end of the contact arm (see claim 2).

Although not particularly limited in the above invention, preferably the determining means has: a classifying section for classifying the appearance failure detected by the failure detecting means into a plurality of failure categories on the basis of predetermined criteria; a counting section for counting a number of failures in each of the failure categories and generating an actual count number for each category; and a comparing section for comparing the actual count number generated by the comparing section with a reference count number for each category with respect to each of the failure categories, and determining whether the abnormality occurs at the interface portion on the basis of the comparison result, the reference count number being preliminarily set as a reference number of failures in each of the failure categories (see claim 3).

Although not particularly limited in the above invention, preferably the comparing section determines that the abnormality occurs at the interface portion when the actual count number is larger than the reference count number with respect to at least one of the failure categories (see claim 4).

Although not particularly limited in the above invention, preferably the abnormality detecting apparatus further comprises an alarming means for informing that the interface portion is abnormal or informing of a failure category which is a cause for an occurrence of the abnormality at the interface portion when the comparing section determines that the abnormality occurs at the interface portion (see claim 5).

Although not particularly limited in the above invention, preferably the obtaining means includes an imaging means for picking up an image of the interface portion (see claim 6).

Although not particularly limited in the above invention, preferably the failure detecting means specifies, as the appearance failure area of the interface portion, an area having a predetermined contrasting density difference from a background in a real image information picked up by the imaging means (see claim 7).

Although not particularly limited in the above invention, preferably the classifying section classifies the appearance failure area into any one of the failure categories on the basis of at least one of contrasting density, shape, or position of the appearance failure area specified by the failure detecting means (see claim 8).

Although not particularly limited in the above invention, preferably the abnormality detecting apparatus further comprises a memory means for memorizing a reference image information of the interface portion which is preliminarily picked up by the imaging means as a reference, and the failure detecting means generates a differential image information by performing a differential processing between the real image information picked up by the imaging means and the reference image information memorized in the memory means and specifies, as the appearance failure area of the interface portion, an area having a predetermined contrasting density difference from a background in the differential image information (see claim 9).

Although not particularly limited in the above invention, preferably the classifying section classifies the appearance failure area into any one of the failure categories on the basis of at least one of contrasting density, shape, or position of the appearance failure area in the differential image information (see claim 10).

Although not particularly limited in the above invention, preferably the abnormality detecting apparatus further comprises an irradiating means for irradiating the interface portion (see claim 11).

Although not particularly limited in the above invention, preferably the irradiating means is capable of irradiating the interface portion with visual light ray or ultraviolet ray, and the imaging means is capable of receiving visual light ray or ultraviolet ray (see claim 12).

Although not particularly limited in the above invention, preferably the irradiating means has a plurality of irradiating units for irradiating the interface portion from mutually different angles (see claim 13).

Although not particularly limited in the above invention, preferably the plurality of irradiating units include: a first irradiating unit for irradiating the interface portion from a first angle and a second irradiating unit for irradiating the interface portion from a second angle different from the first angle, and the failure detecting means specifies, as the appearance failure area of the interface portion, an area having a first contrasting density difference from a background in a first real image information picked up by the imaging means when the first irradiating unit irradiates the interface portion and having a second contrasting density difference from a background in a second real image information picked up by the imaging means when the second irradiating unit irradiates the interface portion (see claim 14).

Although not particularly limited in the above invention, preferably the classifying section classifies the appearance failure area into any one of the failure categories on the basis of at least one of contrasting density, shape, or position of the appearance failure area in the first real image information and at least one of contrasting density, shape, or position of the appearance failure area in the second real image information (see claim 15).

Although not particularly limited in the above invention, preferably the obtaining means includes a three-dimensional measurement apparatus for three-dimensionally obtaining the appearance information of the interface portion (see claim 16).

Although not particularly limited in the above invention, preferably the abnormality detecting apparatus further comprises a starting means for starting the obtaining means at a predetermined timing so that the obtaining means obtains the appearance information of the interface portion, or for making the failure detecting means detect the appearance failure of the interface portion at a predetermined timing (see claim 17).

Although not particularly limited in the above invention, preferably the abnormality detecting apparatus further comprises a counting means for counting a number of contacts of the device under test with the contact portion or counting an occurring number of a predetermined type of failure which occurs in the device under test, and the starting means starts the obtaining means or makes the failure detecting means detect the appearance failure of the interface portion when the counting means counts up to a predetermined number (see claim 18).

Although not particularly limited in the above invention, preferably the abnormality detecting apparatus further comprises a timing means for measuring an elapsed time after starting the test of the device under test, and the starting means starts the obtaining means or makes the failure detecting means detect the appearance failure of the interface portion when the timing means completes to measure a predetermined time duration (see claim 19).

(2) To achieve the above object, according to a second aspect of the present invention, there is provided an electronic device testing apparatus for testing a device under test, comprising: a contact arm for pressing the device under test onto a contact portion of a test head; and the above abnormality detecting apparatus (see claim 20).

(3) To achieve the above object, according to a third aspect of the present invention, there is provided an electronic device testing system comprising: a plurality of electronic device testing apparatuses each having a contact arm for pressing a device under test onto a contact portion of a test head and an abnormality detecting apparatus for detecting an abnormality of an interface portion with the device under test, the interface portion being provided with the contact arm; and a host computer connected with the electronic device testing apparatuses via a communication means, wherein the abnormality detecting apparatus comprises: an obtaining means for obtaining an appearance information of the interface portion of the contact arm; a failure detecting means for detecting an appearance failure of the interface portion on the basis of the appearance information obtained by the obtaining means; and a determining means for determining whether the abnormality occurs at the interface portion on the basis of a detection result by the failure detecting means, the determining means has: a classifying section for classifying the appearance failure detected by the failure detecting means into a plurality of failure categories on the basis of predetermined criteria; a counting section for counting a number of failures in each of the failure categories and generating an actual count number for each category; and a comparing section for comparing the actual count number generated by the counting section with a reference count number for each category with respect to each of the failure categories. and determining whether the abnormality occurs at the interface portion on the basis of the comparison result, the reference count number being preliminarily set as a reference number of failures in each of the failure categories, and each of the electronic device testing apparatuses informs of the actual count number generated by the counting section to the host computer via the communication means in response to a request from the host computer (see claim 21).

Although not particularly limited in the above invention, preferably the comparing section of the abnormality detecting apparatus determines that the abnormality occurs at the interface portion when the actual count number is larger than the reference count number with respect to at least one of the failure categories (see claim 22).

Although not particularly limited in the above invention, preferably the abnormality detecting apparatus further comprises an alarming means for informing that the interface portion is abnormal or informing of a failure category which is a cause for an occurrence of the abnormality at the interface portion when the comparing section determines that the abnormality occurs at the interface portion (see claim 23).

(4) To achieve the above object, according to a fourth aspect of the present invention, there is provided an abnormality detecting method for detecting an abnormality of an interface portion with a device under test, the interface portion being provided with a contact arm for pressing the device under test onto a contact portion of a test head at a time of testing the device under test, the abnormality detecting method comprising: an obtaining step of obtaining an appearance information of the interface portion of the contact arm; a failure detecting step of detecting an appearance failure of the interface portion on the basis of the appearance information obtained in the obtaining step; and a determining step of determining whether the abnormality occurs at the interface portion on the basis of a detection result in the failure detecting step (see claim 24).

Although not particularly limited in the above invention, preferably the interface portion includes a thin-plate-shaped member or a thin-film-shaped member provided on a front end of the contact arm, or a liquid applied on the front end of the contact arm (see claim 25).

Although not particularly limited in the above invention, preferably the determining step includes: a classifying step of classifying the appearance failure detected in the failure detecting step into a plurality of failure categories on the basis of predetermined criteria; a counting step of counting a number of failures in each of the failure categories and generating an actual count number for each category; and a comparing step of comparing the actual count number generated in the counting step with a reference count number for each category with respect to each of the failure categories, and determining whether the abnormality occurs at the interface portion on the basis of the comparison result, the reference count number being preliminarily set as a reference number of failures in each of the failure categories (see claim 26).

Although not particularly limited in the above invention, preferably, in the comparing step, it is determined that the abnormality occurs at the interface portion when the actual count number is larger than the reference count number with respect to at least one of the failure categories (see claim 27).

Although not particularly limited in the above invention, preferably the abnormality detecting method further comprises an alarming step of informing that the interface portion is abnormal or informing of a failure category which is a cause for an occurrence of the abnormality at the interface portion when it is determined that the abnormality occurs at the interface portion in the comparing step (see claim 28).

Although not particularly limited in the above invention, preferably, in the obtaining step, a real image information of the interface portion is obtained by picking up an image of the interface portion (see claim 29).

Although not particularly limited in the above invention, preferably, in the failure detecting step, an area having a predetermined contrasting density difference from a background in the real image information picked up in the obtaining step is specified as the appearance failure area of the interface portion (see claim 30).

Although not particularly limited in the above invention, preferably, in the classifying step, the appearance failure area is classified into any one of the failure categories on the basis of at least one of contrasting density, shape, or position of the appearance failure area specified in the failure detecting step (see claim 31).

Although not particularly limited in the above invention, preferably the abnormality detecting method further comprises a memorizing step of memorizing, as a reference image information of the interface portion, an image information of the interface portion preliminarily picked up, and, in the failure detecting step, a differential image information is generated by performing a differential processing between the real image information picked up in the obtaining step and the reference image information memorized in the memorizing step, and an area having a predetermined contrasting density difference from a background in the differential image information is specified as the appearance failure area of the interface portion (see claim 32).

Although not particularly limited in the above invention, preferably, in the classifying step, the appearance failure area is classified into any one of the failure categories on the basis of at least one of contrasting density, shape, or position of the appearance failure area in the differential image information (see claim 33).

Although not particularly limited in the above invention, preferably, in the obtaining step, a first real image information is obtained by picking up an image of the interface portion while irradiating the interface portion from a first angle and a second real image information is obtained by picking up an image of the interface portion while irradiating the interface portion from a second angle different from the first angle, and in the failure detecting step, an area having a first contrasting density difference from a background in the first real image information and having a second contrasting density difference from a background in the second real image information is specified as the appearance failure area of the interface portion (see claim 34).

Although not particularly limited in the above invention, preferably, in the classifying step, the appearance failure area is classified into any one of the failure categories on the basis of at least one of contrasting density, shape, or position of the appearance failure area in the first real image information and at least one of contrasting density, shape, or position of the appearance failure area in the second real image information (see claim 35).

Although not particularly limited in the above invention, preferably, in the obtaining step, the interface portion is irradiated with visual light ray or ultraviolet ray, and visual light ray or ultraviolet ray reflected from the interface portion is received thereby the real image information of the interface portion is obtained (see claim 36).

Although not particularly limited in the above invention, preferably, in the obtaining step, the appearance information of the interface portion is three-dimensionally obtained (see claim 37).

Although not particularly limited in the above invention, preferably the obtaining step or the failure detecting step is executed when a number of contacts of the device under test with the contact portion is equal to or larger than a predetermined number, an occurring number of a predetermined type of failure which occurs in the device under test is equal to or larger than a predetermined number, or a predetermined time duration is elapsed after starting the test of the device under test (see claim 38).

ADVANTAGEOUS EFFECT OF THE INVENTION

In the present invention, an appearance failure of the interface portion of the contact arm is detected, and it is determined whether an abnormality occurs at the interface portion or not on the basis of the detection result thereof. Therefore, it is possible to maintain a good heat conductivity between the contact arm and the device under test.

BRIEF DESCRIPTION OF DRAWINGS

FIG. 9 is a flowchart illustrating an abnormality detecting method for a TIM according to the embodiment of the present invention.

[Reference Signs List]

Figure 1:
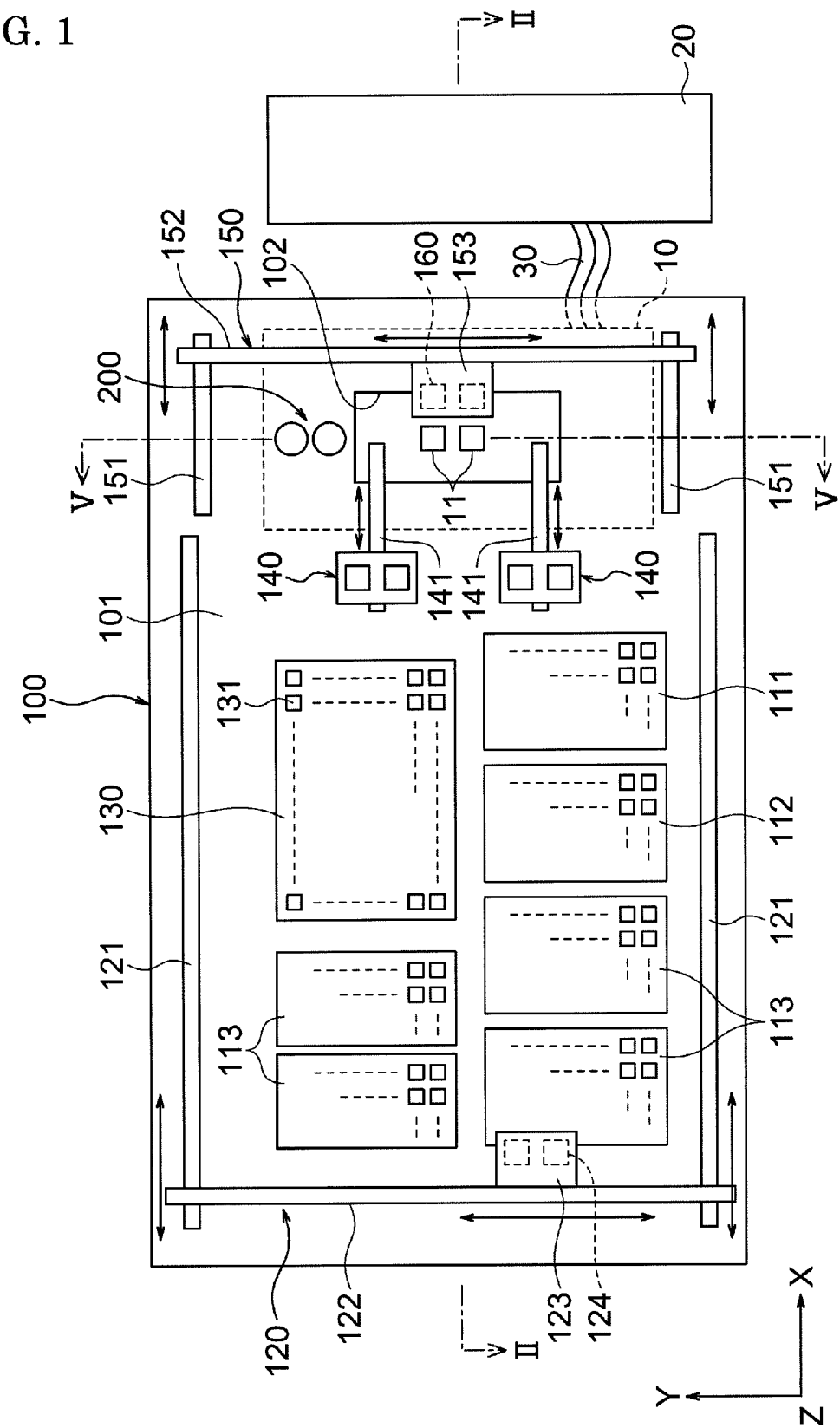
FIG. 1 is a plan view illustrating an electronic device testing apparatus according to an embodiment of the present invention.

| | |
|---|---|
| 150; | moving apparatus |
| 160; | contact arm |
| 161; | pusher |
| 167; | TIM |
| 167a; | appearance failures |
| 200; | abnormality detecting apparatus |
| 210; | imaging device |
| 220; | irradiating device |
| 230; | starting device |
| 240; | image processor device |
| 241; | failure detecting section |
| 250; | memory device |
| 260; | determining device |
| 261; | classifying section |
| 262; | counting section |
| 263; | comparing section |
| 270; | alarming device |

EMBODIMENTS FOR CARRYING OUT THE INVENTION

Hereinafter, embodiments according to the present invention will be described referring to the drawings.

Figure 2:
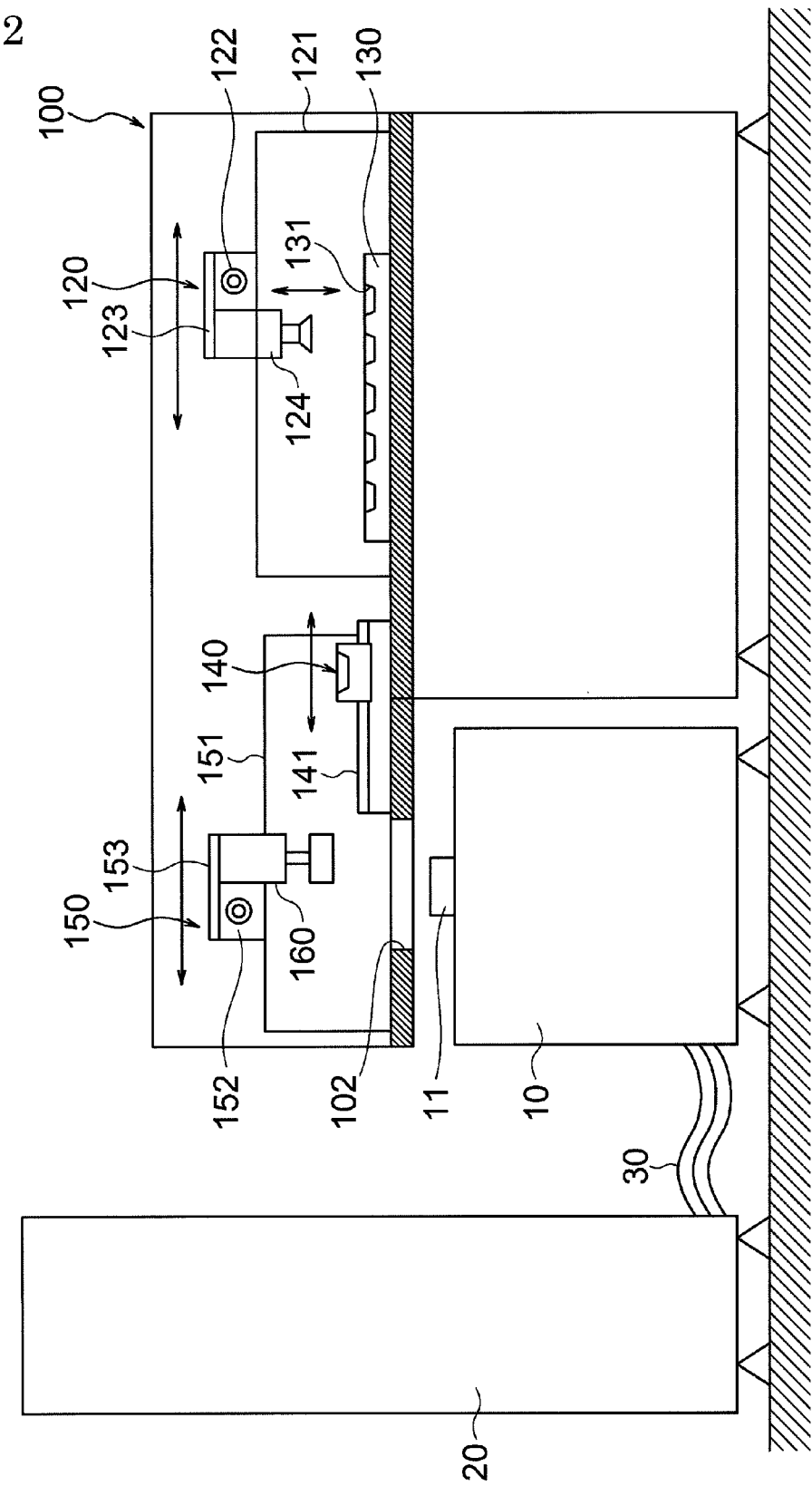
FIG. 2 is a cross sectional view along the line II-II in FIG. 1.
Figure 3:
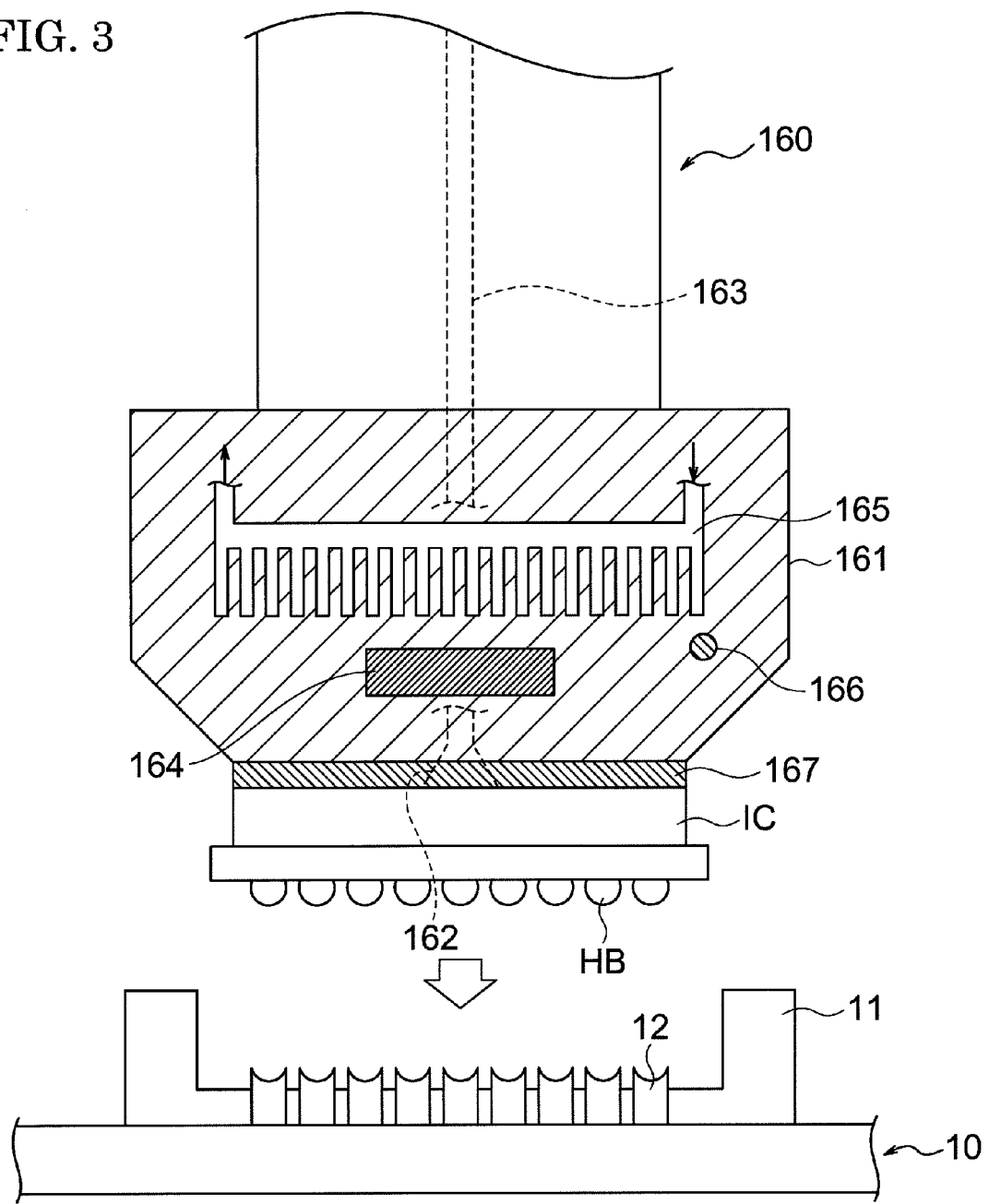
FIG. 3 is a schematic cross sectional view of a contact arm according to the embodiment of the present invention.
Figure 4:
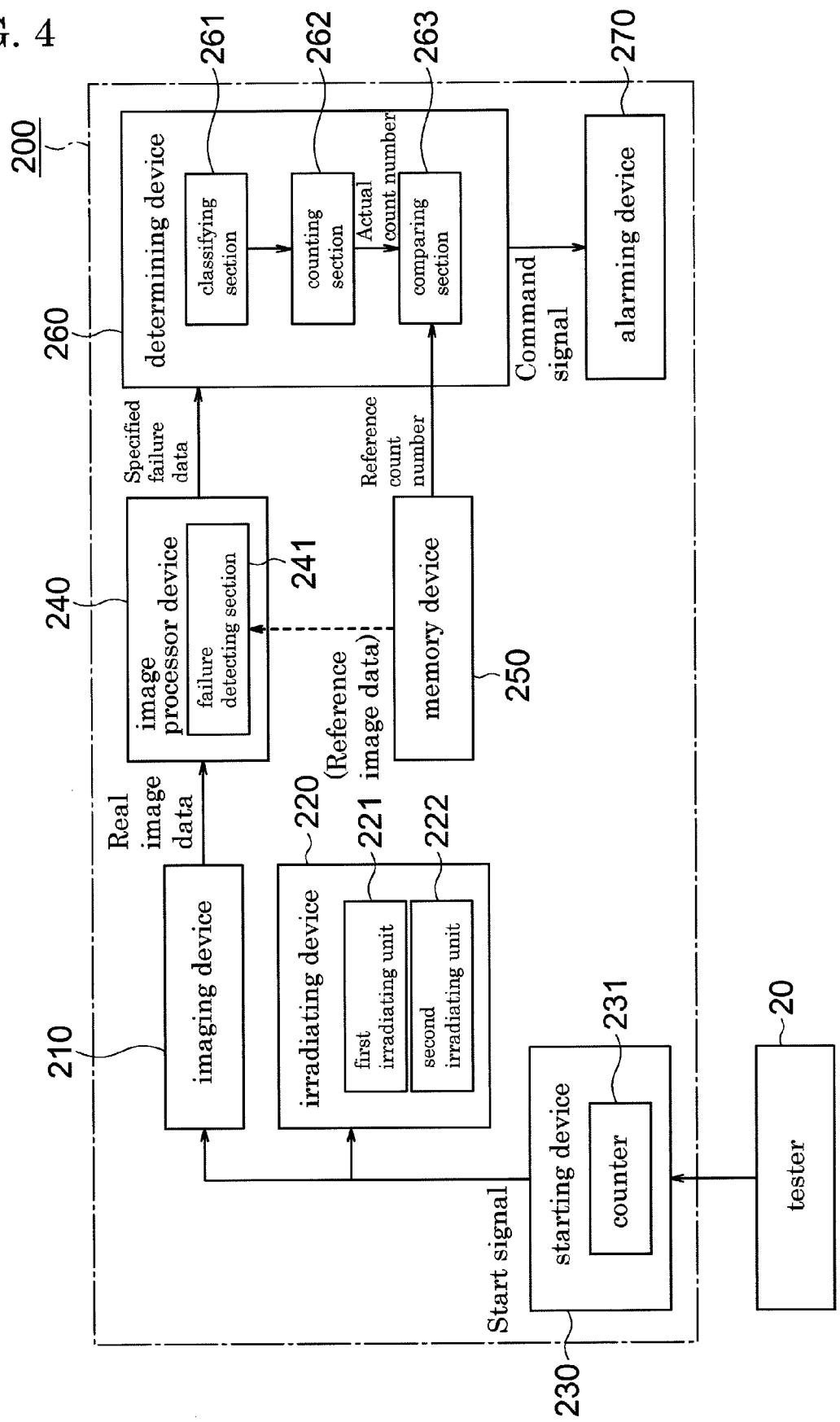
FIG. 4 is a block diagram illustrating an abnormality detecting apparatus according to the embodiment of the present invention.
Figure 5:
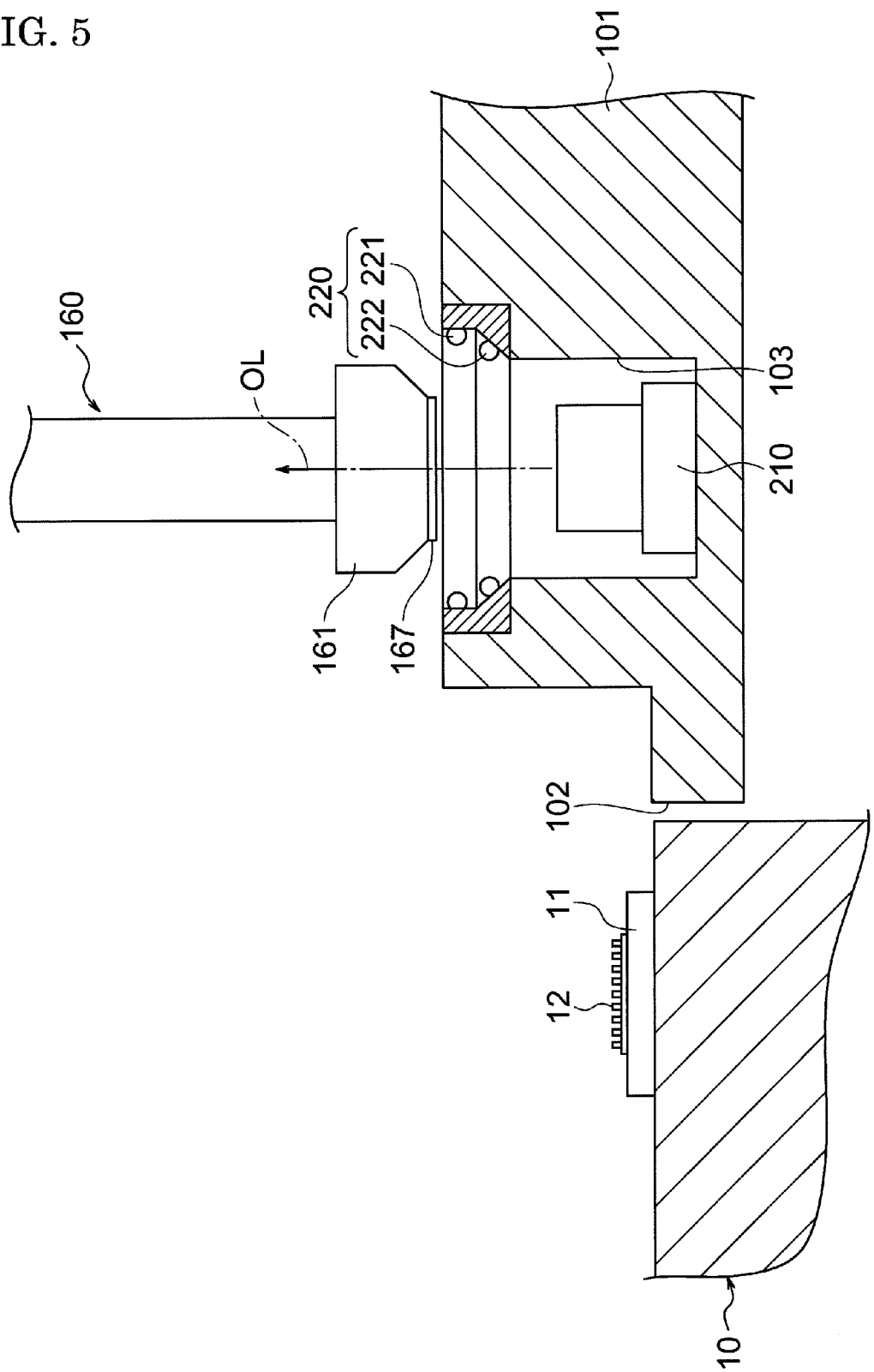
FIG. 5 is a cross sectional view along the line V-V in FIG. 1.
Figure 6:
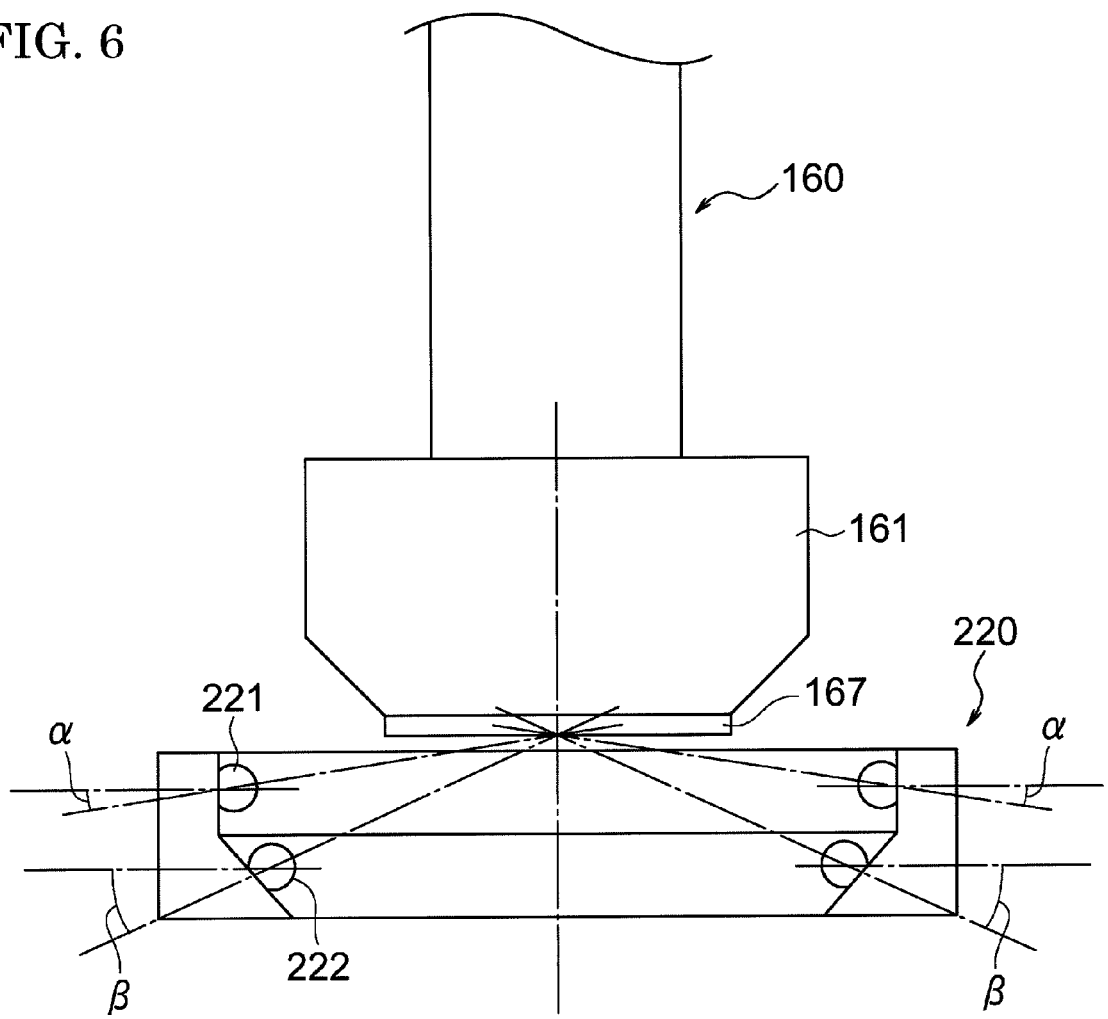
FIG. 6 is a schematic cross sectional view illustrating a irradiating device according to the embodiment of the present invention.
Figure 7:
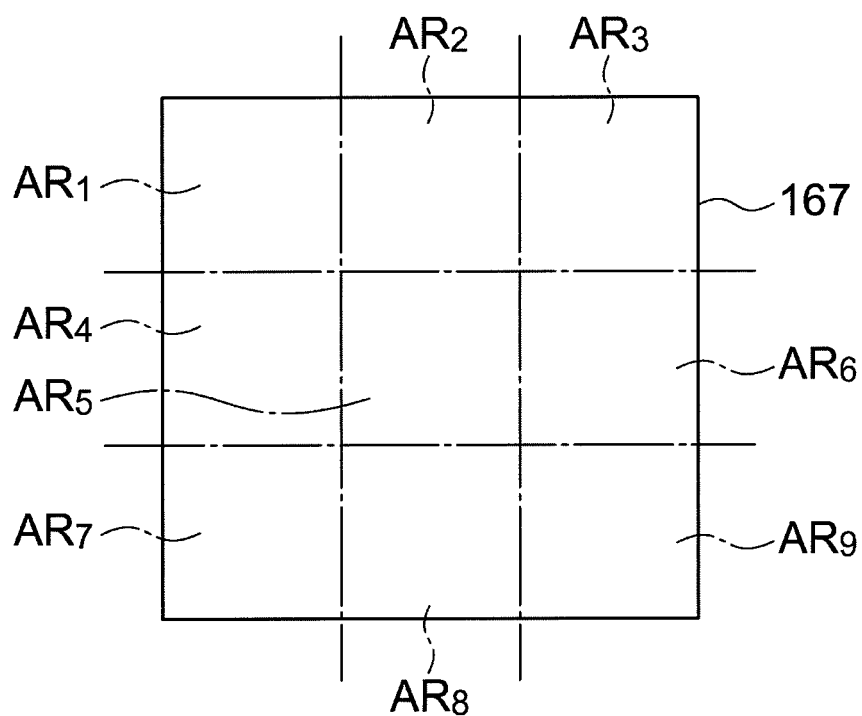
FIG. 7 is a plan view illustrating areas of a TIM according to the embodiment of the present invention.
Figure 8:
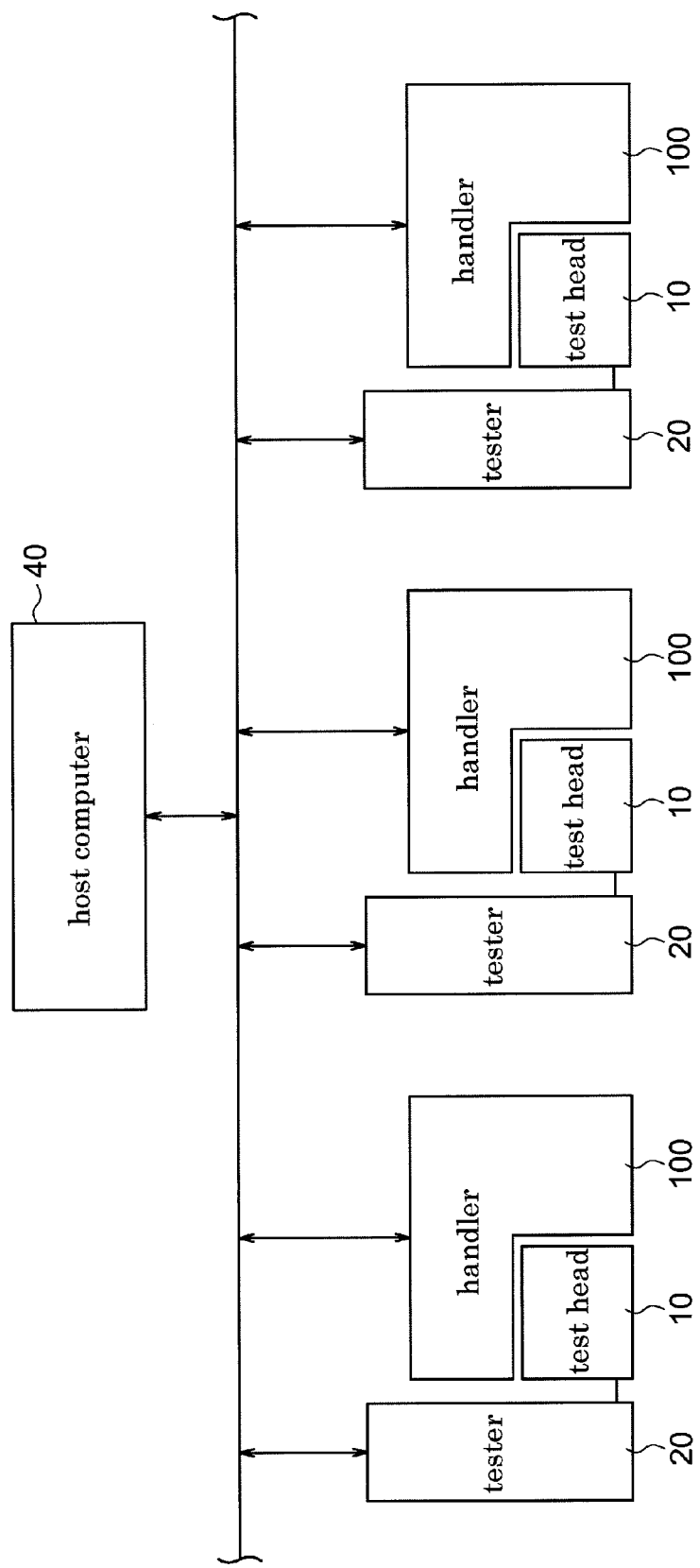
FIG. 8 is a block diagram illustrating an electronic device testing system according to the embodiment of the present invention.

FIG. 1 is a plan view illustrating an electronic device testing apparatus according to an embodiment of the present invention, FIG. 2 is a cross sectional view along the line II-II in FIG. 1, FIG. 3 is a schematic cross sectional view illustrating a contact arm according to the embodiment of the present invention, FIG. 4 is a block diagram illustrating an abnormality detecting apparatus according to the embodiment of the present invention, FIG. 5 is a cross sectional view along the line V-V in FIG. 1, FIG. 6 is a schematic cross sectional view illustrating a irradiating device according to the embodiment of the present invention, FIG. 7 is a plan view illustrating areas of a TIM according to the embodiment of the present invention, and FIG. 8 is a block diagram illustrating an electronic device testing system according to the embodiment of the present invention.

As shown in FIG. 1 and FIG. 2, the electronic device testing apparatus according to the present embodiment comprises a handler 100, a test head 10, and a tester 20, and the test head 10 and the tester 20 are connected with each other via a cable 30. The handler 100 presses IC devices onto sockets 11 of the test head 10 and the tester 20 executes a test of each IC device via the test head 10 and the cable 30, thereafter the handler 100 classifies the IC device completed to be tested in accordance with the test result. Note that, an IC device is indicated by character "IC" in the drawings.

The handler 100 comprises some kinds of trays 111 to 113, a transporter 120, a heat plate 130, buffers 140, and a moving apparatus 150. In addition, the handler 100 has an apparatus board 101 formed with an opening 102. As shown in FIG. 2, the sockets 11 of the test head 10 approach through the opening 102 into the handler 100, thereby it is possible to press IC devices onto the sockets 11.

The transporter 120 comprises: rails 121 installed along the X axis direction on the apparatus board 101; a movable rail 122 established to be movable along the X axis direction on the rails 121; a movable head 123 supported by the movable rail 122 so as to be movable along the Y axis direction; and two suction heads 124 attached to the lower part of the movable head 123. Each of suction heads 124 is capable of being movable along the Z axis direction (that is, up-and-down direction) by means of a Z axis direction actuator not particularly shown in the drawings.

The transporter 120 has an operation area covering a supplying tray 112 on which IC devices to be tested are stored, classified trays 113 on which IC devices completed to be tested are stored after being classified in accordance with the test results, an empty tray 111 without IC devices stored thereon, the heat plate 130, and two buffer units 140.

The transporter 120 is capable of transporting at the same time two IC devices to be tested from the supplying tray 112 to the heat plate 130 or from the heat plate 130 to the buffer unit 140 or transporting also at the same time two IC devices completed to be tested from the buffer unit 140 to the categorized tray 113. Note that, in the present invention, the number of IC devices to be transported at the same time by the transporter 120 may be arbitrarily set. For example, four, eight, 16, or 32 devices may be transported at the same time.

The heat plate 130 is, for example, a metal plate formed with a plurality of concave portions 131 thereon, and an IC device is to be dropped into each of the concave portions 131. Although not particularly shown in the drawings, a heater is provided below the heat plate 130 in order to heat IC devices via the heat plate 130. The transporter 120 transports each IC device from the supplying tray 112 to each concave portion 131 of the heat plate 130. After IC devices are heated to a predetermined temperature by the heat plate 130, the IC device is transported to either one (for example, upper side one in FIG. 1) of the buffer units 140 by the transporter 120.

The two buffer units 140 are capable of reciprocally moving between the operation area of the transporter 120 and an operation area of the moving apparatus 150 by means of rails 141 provided on the apparatus board 101 and actuators not shown. The buffer unit 140 located at upper side in FIG. 1 performs an operation to move IC devices transported from the heat plate 130 by the transporter 120 to the operation area of the moving apparatus 150. On the other hand, the buffer unit 140 located at lower side in FIG. 1 performs an operation to move out IC devices completed to be tested by the test head 10 to the operation area of the transporter apparatus 120.

The moving apparatus 150 comprises: rails 151 installed along the X axis direction on the apparatus board 101; a movable rail 152 established to be movable along the X axis direction on the rails 151; a movable head 153 supported by the movable rail 152 so as to be movable along the Y axis direction; and two contact arms 160 attached to the lower part of the movable head 153 and capable of holding IC devices by suction. Each contact arm 160 is movable along the Z axis direction (that is, up-and-down direction) by means of a Z axis direction actuator not particularly shown in the drawings.

The moving apparatus 150 has the operation area covering the two buffer units 140 and the test head 10. Two IC devices is held by suction from the buffer unit 140 located at upper side in FIG. 1 at the same time, and the IC devices are moved to the sockets 11 of the test head 10 and are pressed onto the sockets 11 at the same time, the IC devices are transported to the buffer unit 140 located at lower side in the figure. Note that, in the present invention, the number of the contact arms 160 attached to the moving apparatus 150 may be arbitrarily set depending on the number of the sockets 11 of the test head 10.

As shown in FIG. 3, each of the contact arms 160 has a pusher 161 on the lower portion thereof in order to press an IC device onto the socket 11 at the time of testing. A suction pad 162 for holding the IC device by suction is provided approximately at the center of the bottom surface of the pusher 161. The suction pad 162 is connected with a negative pressure source not depicted in the figure via a pipe 163 provided inside the contact arm 160.

A heater 164 is provided inside the pusher 161 and is configured with, for example, an electrical heater or the like so as to be able to heat the pusher 161. Also a water jacket 165 which forms a cooler is provided inside the pusher 161. The water jacket 165 is connected with a chiller not depicted in the figure and the pusher 161 is cooled by circulating a refrigerant through the water jacket 165.

Furthermore, a temperature sensor 166 which measures a temperature of the pusher 161 is provided inside the pusher 161. By controlling operations of the heater 164 and the cooler on the basis of the measuring result of the temperature sensor 166, it is possible to maintain the temperature of the IC device at a predetermined temperature.

In addition, in the present embodiment, a TIM (Thermal Interface Material) 167 is attached to the bottom end surface (front end surface) of the pusher 161. The TIM 167 is composed of a material with high thermal conductivity and softness for deformability. The TIM 167 deforms between the bottom end surface of the pusher 161 and the upper surface of the IC device when the contact arm 160 presses the IC device. While voids are formed between the bottom end surface of the pusher 161 and the upper surface of the IC device due to microscopic irregularities with both the surfaces, the TIM 167 deforms so as to fill the voids, and the pusher 161 and the IC device are close contact with each other, thereby the thermal resistance between the pusher 161 and the IC device decreases.

As specific examples of the TIM 167, for example, solid types such as metal foils formed of aluminum, copper, and the like and carbon graphite sheets, gel types like gel states, hybrid types with gel types interleaved between solid types, and liquid types such as glycerine and water may be mentioned.

At the time of testing an IC device, as shown in FIG. 3, the contact arm 160 presses the IC device onto the socket 11 of the test head 10 in the state where the suction pad 162 holds the IC device by suction, and contacts each terminal HB of the IC device with each contact pin 12 of the socket 11. In this state, the tester 20 inputs and outputs a testing signal with respect to the IC device, thereby executing a test of the IC device.

Moreover, in the present embodiment, an abnormality detecting apparatus 200 is provided in the operation area of the moving apparatus 150 in order to detect an abnormality occurring at the TIM 167 attached to the contact arm 160.

As shown in FIG. 4, the abnormality detecting apparatus 200 comprises an imaging device 210, a irradiating device 220, a starting device 230, an image processor device 240, a memory device 250, a determining device 260, and an alarming device 270.

The imaging device 210 has, for example, a CCD sensor or a CMOS sensor. As shown in FIG. 5, the imaging device 210 is arranged in a recessed area 103 with a posture where the optical axis OL is directed upward and the recessed area 103 is formed on the apparatus board 101. Therefore, it is possible that the imaging device 210 images the TIM 167 attached to the contact arm 160 from immediately below. As shown in FIG. 4, the imaging device 210 is connected with the image processor device 240 so as to be able to transmit the image data on which the TIM 167 is captured. Note that, for example, a three-dimensional measurement apparatus using a semiconductor laser is also available for the imaging device 210.

As shown to FIG. 4 to FIG. 6, the irradiating device 220 has two irradiating units 221 and 222. The first irradiating unit 221 is configured with, for example, LEDs arranged in a circular pattern, thereby the center of the bottom surface of the TIM 167 is irradiated with visual light rays at a first angle $\alpha$. While the second irradiating unit 222 is also configured with, for example, LEDs arranged in a circular pattern, the second irradiating unit 222 is provided on the lower side than the first irradiating unit 221, thereby the center of the bottom surface of the TIM 167 is irradiated with visual light rays at a second angle $\beta$.

Herein, the first angle $\alpha$ is, for example, approximately 0 degree to 10 degree of a low angle with respect to the TIM 167. On the contrary, the second angle $\beta$ is, for example, approximately 30 degree to 60 degree of a medium angle with respect to the TIM 167. Using the first irradiating unit 221 of low angle allows to easily detect, for example, lineal scars and microscopic foreign particles. On the other hand, using the second irradiating unit 222 of medium angle allows to easily detect, for example, defects having relatively large surface areas and the like. Note that, in the present invention, the number of the irradiating units in the irradiating device 220 is not limited to two, and the irradiating device may have three or more of the irradiating units.

A color of the irradiating light from the irradiating device 220 may be set depending on the color of the TIM 167, and white or blue may be illustrated by example. In the present invention, the irradiating light from the irradiating device 220 is not particularly limited to visible light rays and may be, for example, ultraviolet rays. In the case of irradiating the surface of the TIM 167 with ultraviolet rays, it is possible to detect microscopic changes occurred on the surface of the TIM 167 by comparison with the case of irradiating with visual light rays. When the irradiating device 220 irradiates with visual light rays, a camera capable of receiving visual light rays is used as the imaging device 210, whereas when the irradiating device 220 irradiates with ultraviolet rays, a camera capable of receiving ultraviolet rays is used as the imaging device 210.

The starting device 230 has a counter 231 for countering a number of contacting between IC devices and the socket 11 (the number being also simply referred to as "contact number", hereinafter) on the basis of the signal from the tester 20. The starting device 230 starts the imaging device 210 and the irradiating device 220 at the time when the counter 231 counts up to a predetermined number.

Note that, the counter 231 may count an occurrence number of IC devices specified with certain testing results on the basis of the signal from the tester 20, and in this case the starting device 230 starts the imaging device 210 and the irradiating device 220 on the basis of with the count result. As examples of the certain testing results (failure modes), a failure and the like regarding the temperature control detected by using a thermal diode provided in the IC device may be mentioned.

In addition, instead of the counter 231, a timer may be provided in the starting device 230 and accumulate an elapsed time after starting to test IC devices. In this case, the starting device 230 starts the imaging device 210 and the irradiating device 220 when the timer completes to measure a predetermined time duration.

Moreover, the starting device 230 may automatically start the imaging device 210 and the irradiating device 220 at the time a testing lot of IC devices is started or finished. Alternatively, the starter device 230 may automatically start the imaging device 210 and the irradiating device 220 at the time an abnormality of the handler 100 is recovered.

The image processor device 240 is configured with an image processor, a ROM, a RAM, and the like not particularly shown in figures, and functionally has a failure detecting section 241. The failure detecting section 241 specifies an appearance failure area of the TIM 167 by processing an image data of the TIM 167 transmitted from the imaging device 210 and transmits the specified failure date to the determining device 260. The specified failure data includes a contrasting density difference, a shape, a position, and the like regarding the appearance failure area.

Herein, the contrasting density difference means a contrasting density difference between the appearance failure area and the periphery thereof in the image data. Further, as examples of the shape, a surface area of the appearance failure area, a boundary length of the appearance failure area, a degree of circularity of the appearance failure area, a maximum length of the appearance failure area, a length in the direction orthogonal to the maximum length in the appearance failure area, and a width and a height of a virtual rectangle circumscribing the appearance failure area, and the like may be mentioned. Furthermore, the position means a coordinate value or the like of the appearance failure area in the image data.

The determining device 260 is configured with a computer having an MPU, a RAM, a ROM, and the like, and functionally has a classifying section 261, a counting section 262, and a comparing section 263.

The classifying section 261 classifies the appearance failure area of the TIM specified by the failure detecting section 241 into a plurality of failure categories on the basis of predetermined criteria. As specific examples of the predetermined criteria for classifying the appearance failure, a region in the TIM 167 to which the appearance failure belongs, a type of the appearance failure of the TIM 167, and the like may be mentioned.

As shown in FIG. 7, as examples of the region in the TIM 167 to which the appearance failure belongs, areas $AR_1$ to $AR_9$ to which the appearance failure belongs when the surface of the TIM 167 is divided into nine areas may be mentioned.

In addition, as examples of types of the appearance failures at the TIM 167, for example, scars, defects (cracks, holes, and peripheral defects), attached foreign particles (attachment of dusts, trashes, and solder balls), and the like may be mentioned.

Thus, the number of failure categories becomes 63 (~9×7) by dividing the locations at the TIM 167 into nine areas $AR_1$ to $AR_9$ and classifying appearance failures occurred respectively in the areas $AR_1$ to $AR_9$ into the above seven types of the appearance failures.

The counting section 262 counts a number of appearance failures occurred in each of the above failure categories and generates an actual count number $P_{N,m}$ for each category. Note that, the subscript N of the actual count number $P_{N,m}$ represents a number of contacts at the time when the failure detecting section 241 detects an appearance failure. Moreover, the subscript m of the actual count number $P_{N,m}$ represents a numeral of the failure category, that is, m=(1 to 63) in the above example.

For example, in the above example, m=(1 to 9) indicate respectively the occurring numbers of the "scars" in the areas $AR_1$ to $AR_9$, m=(10 to 18) indicate respectively the occurring numbers of the "cracks" in the areas $AR_1$ to $AR_9$, ..., and m=(55 to 63) indicate respectively the occurring numbers of the "attachment of solder balls" in the areas $AR_1$ to $AR_9$.

Firstly, the comparing section 263 reads a reference count number $Q_{N,m}$ for each category from the memory device 250 and compares the actual count number $P_{N,m}$ generated by the counting section 262 with the reference count number $Q_{N,m}$ with respect to each failure category. Then, the comparing section 263 determines that an abnormality occurs at the TIM 167 when the actual count number $P_{N,m}$ is larger than the reference count number $Q_{N,m}$ in any one of the failure categories ($P_{N,m} > Q_{N,m}$) and transmits a command signal to the alarming device 270.

Herein, for example, in the case that the pusher 161 of the contact arm 160 has a lower end surface with insufficient flatness, the "scars" occurs considerably and partially at the TIM 167. Moreover, in the case that the contact arm 160 is inclined, the TIM 167 is worn unevenly and the "peripheral defects" occurs. Furthermore, in the case that IC devices have burrs or the handler 100 is used in a dusty environment, considerable "foreign particles" are attached to the TIM 167. In the present embodiment, such abnormalities of the TIM 167 are detected by comparing the actual count number $P_{N,m}$ with the reference count number $Q_{N,m}$ with respect to each failure category.

The reference count number $Q_{N,m}$ stored in the memory device 250 is a data which is obtained by classifying appearance failures which occur at a TIM 167 over time in situation where the TIM 167 is used in an average environment into the above failure categories, and preliminarily counting a number of the appearance failure areas with respect to each failure category. The reference count number $Q_{N,m}$ is stored in the memory device 250 for each certain contact number (for example, each 100 times of contacts).

The alarming device 270 alarms an operator via for example a speaker, an operation screen of the handler 100, and the like in response to the command signal from the determining device 260 and informs that the TIM 167 is in abnormality. Note that, the alarming device 270 may inform of the failure category which is a cause for an occurrence of the abnormality at the TIM 167. The operator can immediately anticipate a cause of the abnormality occurrence by being informed of the failure category as the cause.

As shown in FIG. 8, in the case that a plurality of electronic device testing apparatuses each configured with the handler 100, the test head 10, and the tester 20 are connected with a host computer 40 via a communication means such as an in-plant LAN, the abnormality detecting apparatus 200 may transmit the actual count number $P_{N,m}$ generated by the counter section 262 of the determining device 260 to the host computer 40.

Figure 10A:
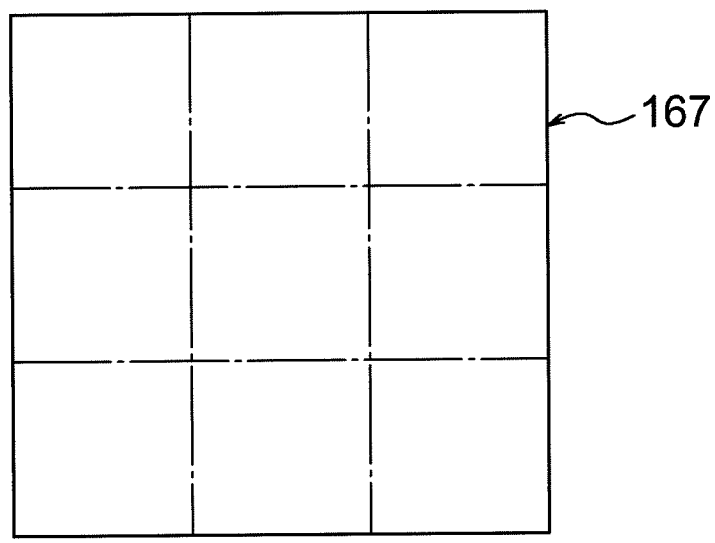
FIG. 10A is a view illustrating an example of image data of a TIM without appearance failures in the embodiment according to the present invention.
Figure 10B:
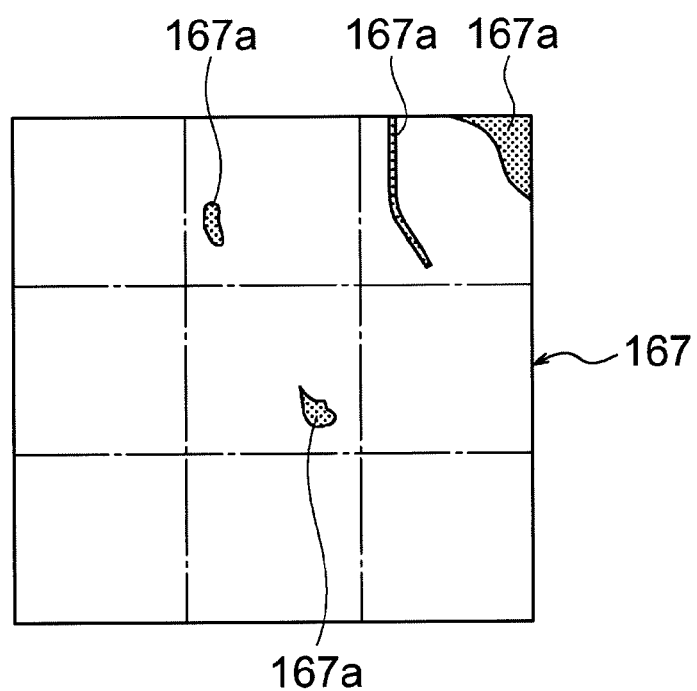
FIG. 10B is a view illustrating an example of image data of a TIM with appearance failures in the embodiment according to the present invention.
Figure 10C:
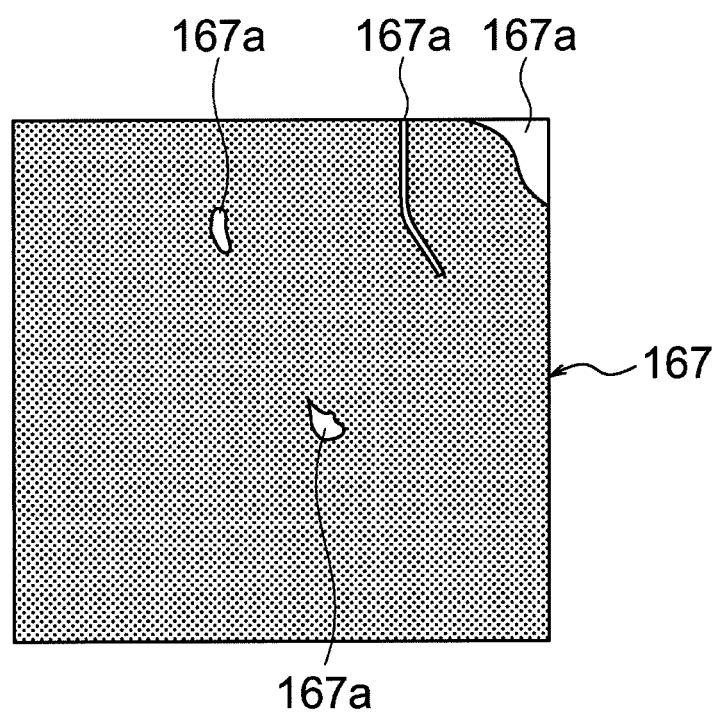
FIG. 10C is a view illustrating an example of differential image data of a TIM generated in an another embodiment according to the present invention.

FIG. 9 is a flowchart illustrating an abnormality detecting method for a TIM according to the embodiment of the present invention, FIG. 10A is a view illustrating an example of image data of a TIM without appearance failures in the embodiment according to the present invention, FIG. 10B is a view illustrating an example of image data of a TIM with appearance failures in the embodiment according to the present invention, and FIG. 10C is a view illustrating an example of differential image data generated in an another embodiment according to the present invention.

Hereinafter, the abnormality detecting method for a TIM according to the embodiment of the present invention will be described referring to FIG. 9.

At first, as shown in FIG. 9, after the contact arm 160 of the handler 100 presses IC devices onto the sockets 11 and the tester 20 executes testing of the IC devices (step S100), the counter 231 of the starting device 230 adds 1 to the contact number n (step S110). The starting device 230 compares the counting result n by the counter 231 with a predetermined number N (for example 100 times), and if it is determined that the counting result n is smaller than the predetermined number N, the handler 100 continues to test the IC devices (NO in step S120).

On the contrary, if the counting result n is the predetermined number N or more (YES in step S120), the contact arm 160 moves to the abnormality detecting apparatus 200 (step S130), and the starting device 230 starts the imaging device 210 and the irradiating device 220 (step S140). Particularly in step S130, the contact arm 160 moves downward to the vicinity of the irradiating device 220, thereby it is minimally suppressed that external light lights the TIM 167.

After the starting device 230 starts the imaging device 210 and the irradiating device 220, the irradiating device 220 irradiates the TIM 167, and the imaging device 210 picks up an image of the TIM 167 (step S150).

The image data of the TIM 167 obtained by the imaging device 210 is transmitted to the image processor device 240. The failure detecting section 241 of the image processor device 240 specifies an appearance failure area at the TIM 167 by subjecting the image data to an image processing such as a threshold processing and a blob processing (step S160).

Specifically, the appearance failure is specified as follows. While the TIM 167 without appearance failures provides image data having an even brightness as shown in FIG. 10A, the TIM 167 with appearance failures 167a provides contrasts (contrasting density differences) at the locations of the appearance failures 167a as shown in FIG. 10B. Consequently, in the present embodiment, the threshold processing is used to specify, as appearance failures, bright areas with certain higher brightness or more relatively to the background in TIM 167 or dark areas with certain lower brightness or less relatively to the background in TIM 167.

Note that, appearance failure areas of the TIM 167 may be specified as follows. Firstly, the image data of a TIM 167 without appearance failures as shown in FIG. 10A is preliminarily stored in the memory device 250 as reference image data. Then, the failure detecting section 241 reads the reference image data from the memory device 250, and generates a differential image data (refer to FIG. 10C) between the real image data (refer to FIG. 10B) obtained by the imaging device 210 and the reference image data. In this differential image data, bright areas with certain higher brightness or more relatively to the background or dark areas with certain lower brightness or less relatively to the background are specified as the appearance failures 167a.

Particularly in the case of adopting a three-dimensional measurement apparatus, it is possible to directly obtain irregularity on the surface of the TIM 167 as a height data, and portions in which the height data changes are specified as appearance failure areas.

After specifying the appearance failure areas at the TIM 167, the failure detecting section 241 transmits a specified failure data to the determining device 160. The specified failure data includes a contrasting density difference, a shape, and a position with respect to each failure area.

The classifying section 261 of the determining device 260 classifies the appearance failure areas specified by the failure detecting section 241 into failure categories (step S170). More specifically, the appearance failure areas are firstly classified into the areas $AR_1$ to $AR_9$, and then, in each of the areas $AR_1$ to $AR_9$, the appearance failure areas are classified into types such as "scars" and "cracks" on the basis of the contrasting density differences and shapes of the appearance failure areas. As a result in the above example, the appearance failures occurred at the TIM 167 are classified into 63 types of failure categories.

For example, if the length in the direction orthogonal to the maximum length of an appearance failure area is shorter than the maximum length (i.e. the appearance failure area is elongated) and the appearance failure area is brighter than the background, the appearance failure is classified into "scars".

On the other hand, if an appearance failure is elongated and bright area and dark area pair up, the appearance failure area is classified into "cracks".

Moreover, if an appearance failure area is dark under the first irradiating unit 221 irradiating the TIM 167 (having a first contrasting density difference from the background), is bright under the second irradiating unit 222 (having a second contrasting density difference from the background), and has a relatively small surface area, the appearance failure area is classified into "attachment of dusts".

Furthermore, if an appearance failure area is relatively bright compared to the peripheral area thereof and the degree of circularity (=(boundary length)$^2$/(surface area)) is approximately equal to $4\pi$, the appearance failure area is classified into "attachment of solder balls".

In addition, portions which are other than the above and have relatively large surface areas are specified as "holes", "peripheral defects", and "attachment of trashes". Further, "holes" and "peripheral defects" are distinguished according to the positional relationship between the TIM 167 and the appearance failure areas, and "holes" and "attachment of trashes" are distinguished according to the difference in brightness. Note that, the types of appearance failures and classifying method thereof described herein are merely examples, and the present invention is not particularly limited to the examples.

Then, the counting section 262 of the determining device 260 counts the number of appearance failure areas in each failure category and generates the actual count number $P_{N,m}$ for each category (step S180).

Next, the comparing section 263 of the determining device 260 reads the reference count number $Q_{N,m}$ for each category from the memory device 250 (step S190), and compares the actual count number $P_{N,m}$ generated by the counting section 262 with the reference count number $Q_{N,m}$ with respect to each failure category (step S190).

In the comparison of step S190, if it is determined that the actual count number $P_{N,m}$ is the reference count number $Q_{N,m}$ or less in any failure category (NO in step S200), the comparing section 263 determines that an abnormality is absent at the TIM 167. In this case, after adding, for example, 100 to N (step S200), the handler 100 continues to perform the test of the IC device. According to step S200, the next abnormality detecting of the TIM 167 is automatically executed after further counting the contact number of 100 times.

On the contrary, in the comparison of step S190, if it is determined that the actual count number $P_{N,m}$ is larger than the reference count number $Q_{N,m}$ ($P_{N,m} > Q_{N,m}$) in any one of the failure categories, the comparing section 263 transmits the command signal to the alarming device 270 (YES in step S200). Note that, the comparing section 263 may transmit the command signal to the alarming device 270 only when it is determined that the actual count number $P_{N,m}$ is larger than the reference count number $Q_{N,m}$ ($P_{N,m} > Q_{N,m}$) in a plurality of the failure categories.

The alarming device 270 informs, for example, an operator that an abnormality occurs at the TIM 167 in accordance with the command signal from the comparing section 263 (step S220).

As described above, in the present embodiment, appearance failures of the TIM 167 are detected, and it is determined whether an abnormality occurs at the TIM 167 on the basis of the detecting result. Therefore, it is possible to maintain a good heat conductivity between the pusher 161 of the contact arm 160 and IC devices.

Note that, the embodiments explained above were described to facilitate the understanding of the present invention, but were not described to limit the present invention. Therefore, the elements disclosed in the embodiments include all design equivalents falling under the technical scope of the present invention.

For example, although the above embodiments are described as such that the contact arm 160 is provided with both the heater 164 and the cooler 165, the present invention is not particularly limited to this. For example, the present invention may be applied to a contact arm provided merely with a heater.

Moreover, although the above embodiments are described as such that failures are classified into failure categories in accordance with contrasting density, shape, and position, the present invention is not particularly limited to this. For example, failures may be classified into failure categories in accordance merely with only position or in accordance with contrasting density and position.

Furthermore, although the above embodiments are described as such that the abnormality of the TIM 167 attached to the front end of the contact arm 160 is detected by using the abnormality detecting apparatus 200, the present invention is not particularly limited to this. For example, in the case of a type of contact arm not to be attached with the TIM 167, an abnormality of the front end surface of the pusher provided with the contact arm may be detected by using the abnormality detecting apparatus according to the present invention.

Still furthermore, at the time of peeling off the TIM of the gel type or the liquid type from the pusher 161, the abnormality detecting apparatus according to the present invention may be used for detecting the wiping remain of the TIM (contamination or residue due to the TIM) as an abnormality of the bottom end surface of the pusher 161.

In addition, although the above embodiments are described as such that the starting device 230 starts the imaging device 210 and the irradiating device 220 at a predetermined timing, the present invention is not particularly limited to this. For example, while the imaging device 210 and the irradiating device 220 are continuously operating, the starting device 230 may make the failure detecting section 241 detect appearance failures of the TIM 167 at a predetermined timing.

The invention claimed is:

1. An abnormality detecting apparatus configured to detect an abnormality of an interface portion of a contact arm of an electric device testing apparatus that tests a device under test the interface portion contacting the device under test when testing the device under test, the abnormality detecting apparatus comprising:
    an obtaining device configured to obtain appearance information of the interface portion of the contact arm, when the interface portion is out of contact with the device under test;
    a failure detector configured to detect an appearance failure of the interface portion of the contact arm on the basis of the appearance information obtained by the obtaining device; and
    a determining device configured to determine whether the abnormality occurs at the interface portion on the basis of a detection result by the failure detector.

2. The abnormality detecting apparatus as set forth in claim 1, wherein the interface portion includes a thin-plate-shaped member or a thin-film-shaped member provided on a front end of the contact arm, or a liquid applied on the front end of the contact arm.

3. The abnormality detecting apparatus as set forth in claim 1, wherein the determining device has:
    a classifier configured to classify the appearance failure detected by the failure detector into a plurality of failure categories on the basis of predetermined criteria;
    a counter configured to count a number of failures in each of the failure categories, and to generate an actual count number for each category; and
    a comparator configured to compare the actual count number with a reference count number with respect to each of the failure categories, and to determine whether the abnormality occurs at the interface portion on the basis of the comparison result, the reference count number being set in advance as a reference number of failures in each of the failure categories.

4. The abnormality detecting apparatus as set forth in claim 3, wherein the comparator determines that the abnormality occurs at the interface portion when the actual count number is larger than the reference count number with respect to at least one of the failure categories.

5. The abnormality detecting apparatus as set forth in claim 4, further comprising an alarm configured to inform that the interface portion is abnormal, or to inform of a failure category which is a cause for an occurrence of the abnormality at the interface portion of the contact arm when the comparator determines that the abnormality occurs at the interface portion.

6. The abnormality detecting apparatus as set forth in claim 1, wherein the obtaining device includes an imaging device configured to pick up an image of the interface portion of the contact arm.

7. The abnormality detecting apparatus as set forth in claim 6, wherein the failure detector specifies, as an appearance failure area of the interface portion of the contact arm, an area having a predetermined contrast density difference from a background in the image of the interface portion picked up by the imaging device.

8. The abnormality detecting apparatus as set forth in claim 7, further comprising classify the appearance failure area into one of a plurality of failure categories, on the basis of at least one of contrasting density, shape, or position of the appearance failure area specified by the failure detector.

9. The abnormality detecting apparatus as set forth in claim 6, further comprising a memory device configured to memorize reference image information of the interface portion which is picked up in advance by the imaging device as a reference, wherein
the failure detector generates a differential image information by performing differential processing between the image of the interface portion of the contact arm picked up by the imaging device and the reference image information memorized in the memory device and specifies, as an appearance failure area of the interface portion, an area having a predetermined contrast density difference from a background in the differential image information.

10. The abnormality detecting apparatus as set forth in claim 9, further comprising a classifier configured to classify the appearance failure area into one of failure categories on the basis of at least one of contrasting density, shape, or position of the appearance failure area in the differential image information.

11. The abnormality detecting apparatus as set forth in claim 6, further comprising an irradiating device configured to irradiate the interface portion.

12. The abnormality detecting apparatus as set forth in claim 11, wherein the irradiating device irradiates the interface portion with a visible light ray or an ultraviolet ray, and
the imaging device receives the visible light ray or the ultraviolet ray.

13. The abnormality detecting apparatus as set forth in claim 11, wherein the irradiating device has a plurality of irradiators configured to irradiate the interface portion from mutually different angles.

14. The abnormality detecting apparatus as set forth in claim 13, wherein the plurality of irradiators include:
a first irradiator configured to irradiate the interface portion from a first angle; and
a second irradiator configured to irradiate the interface portion from a second angle different from the first angle, and
the failure detector specifies, as an appearance failure area of the interface portion, an area having a first contrast density difference from a background in first real image information picked up by the imaging device when the first irradiator irradiates the interface portion and having a second contrast density difference from a background in second real image information picked up by the imaging device when the second irradiator irradiates the interface portion.

15. The abnormality detecting apparatus as set forth in claim 14, wherein the classifier classifies the appearance failure area into one of failure categories on the basis of at least one of contrasting density, shape, or position of the appearance failure area in the first real image information and at least one of contrasting density, shape, or position of the appearance failure area in the second real image information.

16. The abnormality detecting apparatus as set forth in claim 1, wherein the obtaining device includes a three-dimensional measurement apparatus for three-dimensionally obtaining the appearance information of the interface portion.

17. The abnormality detecting apparatus as set forth in claim 1, further comprising a starting device configured to start the obtaining device at a predetermined timing so that the obtaining device obtains the appearance information of the interface portion, or configured to make the failure detector detect the appearance failure of the interface portion at a predetermined timing.

18. The abnormality detecting apparatus as set forth in claim 17, further comprising a counting device configured to count a number of contacts of the device under test with the interface portion of the contact arm or to count an occurring number of a predetermined type of failure which occurs in the device under test, wherein
the starting device starts the obtaining device or makes the failure detector detect the appearance failure of the interface portion when the counting device counts up to a predetermined number.

19. The abnormality detecting apparatus as set forth in claim 17, further comprising a timing device configured to measure an elapsed time after starting the test of the device under test, wherein
the starting device starts the obtaining device or makes the failure detector detect the appearance failure of the interface portion when the timing device completes measuring a predetermined time duration.

20. An electronic device testing apparatus comprising:
the contact arm is configured to press the device under test onto a contact portion of a test head; and
the abnormality detecting apparatus as set forth in claim 1.

21. An electronic device testing system comprising:
a plurality of electronic device testing apparatuses each having a contact arm and an abnormality detecting apparatus configured to detect an abnormality of an interface portion of the contact arm that contacts the device under test when testing the device under test; and
a host computer connected with the electronic device testing apparatuses via a communication device, wherein
the abnormality detecting apparatus comprises:
an obtaining device configured to obtain appearance information of the interface portion of the contact arm;
a failure detector configured to detect an appearance failure of the interface portion on the basis of the appearance information obtained by the obtaining device; and
a determining device configured to determine whether the abnormality occurs at the interface portion on the basis of a detection result by the failure detector, the determining device comprises:
a classifier configured to classify the appearance failure detected by the failure detector into a plurality of failure categories on the basis of predetermined criteria;
a counter configured to count a number of failures in each of the failure categories and to generate an actual count number for each category; and
a comparator configured to compare the actual count number with a reference count number with respect to each of the failure categories, and to determine whether the abnormality occurs at the interface portion on the basis of the comparison result, the reference count number being set in advance as a reference number of failures in each of the failure categories, and each of the electronic device testing apparatuses informs of the actual count number generated by the counter to the host computer via the communication device in response to a request from the host computer.

22. The electronic device testing system as set forth in claim 21, wherein the comparator of the abnormality detecting apparatus determines that the abnormality occurs at the interface portion when the actual count number is larger than the reference count number with respect to at least one of the failure categories.

23. The electronic device testing system as set forth in claim 22, wherein the abnormality detecting apparatus comprises an alarm configured to inform that the interface portion is abnormal or to inform of a failure category which is a cause for an occurrence of the abnormality at the interface portion when the comparator determines that the abnormality occurs at the interface portion.

24. An abnormality detecting method for detecting an abnormality of an interface portion of a contact arm of an electric device testing apparatus that tests a device under test the interface portion contacting the device under test when testing the device under test, the abnormality detecting method comprising:
(a) obtaining appearance information of the interface portion of the contact arm, when the interface portion is out of contact with the device under test;
(b) detecting an appearance failure of the interface portion of the contact arm on the basis of the appearance information obtained in the (a); and
(c) determining whether the abnormality occurs at the interface portion on the basis of a detection result in the (b).

25. The abnormality detecting method as set forth in claim 24, wherein the interface portion includes a thin-plate-shaped member or a thin-film-shaped member provided on a front end portion of the contact arm, or a liquid applied on the front end portion of the contact arm.

26. The abnormality detecting method as set forth in claim 24, wherein the (c) includes:
(c-1) classifying the appearance failure detected in the (b) into a plurality of failure categories on the basis of predetermined criteria;
(c-2) counting a number of failures in each of the failure categories and generating an actual count number for each category; and
(c-3) comparing the actual count number with a reference count number with respect to each of the failure categories, and determining whether the abnormality occurs at the interface portion on the basis of the comparison result, the reference count number being set in advance as a reference number of failures in each of the failure categories.

27. The abnormality detecting method as set forth in claim 26, wherein, in the (c-3), it is determined that the abnormality occurs at the interface portion when the actual count number is larger than the reference count number with respect to at least one of the failure categories.

28. The abnormality detecting method as set forth in claim 26, further comprising (d) informing that the interface portion is abnormal or informing of a failure category which is a cause for an occurrence of the abnormality at the interface portion when it is determined that the abnormality occurs at the interface portion in the (c-3).

29. The abnormality detecting method as set forth in claim 26, wherein, in the (a), a real image information of the interface portion is obtained by picking up an image of the interface portion.

30. The abnormality detecting method as set forth in claim 29, wherein, in the (b), an area having a predetermined contrast density difference from a background in the real image information picked up in the (a) is specified as an appearance failure area of the interface portion.

31. The abnormality detecting method as set forth in claim 30, wherein, in the (c-1), the appearance failure area is classified into one of the failure categories on the basis of at least one of contrasting density, shape, or position of the appearance failure area specified in the (b).

32. The abnormality detecting method as set forth in claim 29, further comprising (e) memorizing as reference image information of the interface portion, an image information of the interface portion picked up in advance, wherein
in the (b), differential image information is generated by performing differential processing between the real image information picked up in the (a) and the reference image information memorized in the (e), and an area having a predetermined contrast density difference from a background in the differential image information is specified as the appearance failure area of the interface portion.

33. The abnormality detecting method as set forth in claim 32, wherein, in the (c-1), the appearance failure area is classified into one of the failure categories on the basis of at least one of contrasting density, shape, or position of the appearance failure area in the differential image information.

34. The abnormality detecting method as set forth in claim 29, wherein
in the (a), first real image information is obtained by picking up an image of the interface portion while irradiating the interface portion from a first angle, and second real image information is obtained by picking up an image of the interface portion while irradiating the interface portion from a second angle different from the first angle, and
in the (b), an area having a first contrast density difference from a background in the first real image information and having a second contrast density difference from a background in the second real image information is specified as the appearance failure area of the interface portion.

35. The abnormality detecting method as set forth in claim 34, wherein, in the (c-1), the appearance failure area is classified into one of the failure categories on the basis of at least one of contrasting density, shape, or position of the appearance failure area in the first real image information and at least one of contrasting density, shape, or position of the appearance failure area in the second real image information.

36. The abnormality detecting method as set forth in claim 29, wherein, in the (a), the interface portion is irradiated with a visible light ray or an ultraviolet ray, and the real image information of the interface portion is obtained by receiving the visible light ray or the ultraviolet ray reflected from the interface portion.

37. The abnormality detecting method as set forth in claim 24, wherein, in the (a), the appearance information of the interface portion is three-dimensionally obtained.

38. The abnormality detecting method as set forth in claim 24, wherein the (a) or the (b) is executed when a number of contacts of the device under test with the interface portion of the contact arm is equal to or larger than a predetermined number, an occurring number of a predetermined type of failure which occurs in the device under test is equal to or larger than a predetermined number, or a predetermined time duration is elapsed after starting the test of the device under test.

* * * * *